United States Patent
Kim et al.

(10) Patent No.: US 11,954,890 B2
(45) Date of Patent: Apr. 9, 2024

(54) APPARATUS AND METHOD FOR FAST REFINING SEGMENTATION FOR V-PCC ENCODERS

(71) Applicant: KOREA ELECTRONICS TECHNOLOGY INSTITUTE, Seongnam-si (KR)

(72) Inventors: Yong Hwan Kim, Anyang-si (KR); Jieon Kim, Seoul (KR); JinGang Huh, Seoul (KR); Jong-geun Park, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 364 days.

(21) Appl. No.: 17/233,195

(22) Filed: Apr. 16, 2021

(65) Prior Publication Data

US 2022/0172404 A1    Jun. 2, 2022

(30) Foreign Application Priority Data

Nov. 27, 2020 (KR) .................. 10-2020-0162491

(51) Int. Cl.
   *G06T 9/00*     (2006.01)
   *G06T 3/40*     (2006.01)
   *H03M 7/30*     (2006.01)

(52) U.S. Cl.
   CPC .......... *G06T 9/001* (2013.01); *G06T 3/40* (2013.01); *H03M 7/3064* (2013.01); *H03M 7/6011* (2013.01)

(58) Field of Classification Search
   CPC .. G06T 9/001; G06T 3/40; G06T 9/00; G06T 2207/10028; H03M 7/3064;
   (Continued)

(56) References Cited

U.S. PATENT DOCUMENTS 9,094,615 B2 *   7/2015   Aman ............... G06T 19/006
11,259,050 B2 *  2/2022   Ilola ................ H04N 21/26258
(Continued)

FOREIGN PATENT DOCUMENTS

WO    2020/190114 A1    9/2020

OTHER PUBLICATIONS

Office Action in Korean Korean Application No. 10-2020-0162491 dated Nov. 11, 2021 in 7 pages.

Primary Examiner — Mia M Thomas
(74) Attorney, Agent, or Firm — Knobbe, Martens, Olson & Bear, LLP

(57) ABSTRACT

The present disclosure relates to an apparatus and method for fast refining segmentation for a V-PCC encoder. The apparatus may include a grid segmentation unit segmenting a coordinate space of a point cloud into grid units, and an edge cube search unit searching a cube containing one or more points among the cubes segmented into grid units and containing a segment boundary. The apparatus may also include a surrounding cube search unit searching an edge surrounding cube containing one or more points within a predetermined range from the edge cube, and a smooth score calculation unit calculating smooth scores for all the edge surrounding cubes and all the edge cubes. The apparatus may further include a projection plane index update unit obtaining a normal score based on the calculated smooth scores and updating a projection plane index of each point in the edge cube using the normal score.

8 Claims, 4 Drawing Sheets

(58) Field of Classification Search
CPC .... H03M 7/6011; H03M 7/70; H04N 19/597; H04N 19/54; H04N 19/57; H04N 19/70
See application file for complete search history.

(56) References Cited

U.S. PATENT DOCUMENTS

| | | | |
|---|---|---|---|
| 11,368,717 B2* | 6/2022 | Zhang | H04N 19/96 |
| 11,409,998 B2* | 8/2022 | Mammou | G06F 18/22 |
| 11,514,611 B2* | 11/2022 | Mammou | G06T 19/20 |
| 11,581,022 B2* | 2/2023 | Ilola | G11B 27/34 |
| 11,595,670 B2* | 2/2023 | Aksu | H04N 19/70 |
| 11,659,151 B2* | 5/2023 | Aflaki | G06T 7/41 |
| | | | 345/419 |
| 2010/0008424 A1* | 1/2010 | Pace | H04N 19/433 |
| | | | 375/E7.125 |
| 2016/0086353 A1* | 3/2016 | Lukac | G06T 9/00 |
| | | | 345/419 |
| 2018/0109810 A1* | 4/2018 | Xu | H04N 19/176 |
| 2019/0197739 A1* | 6/2019 | Sinharoy | G06T 7/55 |
| 2020/0221134 A1 | 7/2020 | Faramarzi et al. | |
| 2022/0108483 A1* | 4/2022 | Graziosi | H04N 19/597 |
| 2022/0191544 A1* | 6/2022 | Schwarz | H04N 19/177 |
| 2022/0256131 A1* | 8/2022 | Oh | H04N 19/184 |

* cited by examiner

APPARATUS AND METHOD FOR FAST REFINING SEGMENTATION FOR V-PCC ENCODERS

CROSS-REFERENCE TO RELATED APPLICATION

This application claims priority to and the benefit of Korean Patent Application No. 10-2020-0162491, filed on Nov. 27, 2020, the disclosure of which is incorporated herein by reference in its entirety.

TECHNICAL FIELD

The present disclosure relates to a video-based point cloud compression (V-PCC) encoder, and more particularly, to a technique for refining segmentation.

BACKGROUND

Point cloud literally means a collection of points expressed in three-dimensional space. It was intermediate data used to convert 3D data acquired with 3D scanners into other models. And recently, as the computation speed is increased by multi cores and GPUs, there are attempts to use the point cloud as it is to express a 3D model.

MPEG (Moving Picture Expert Group) standardized V-PCC (to compress a 3D point cloud based on 2D video. V-PCC is a method of segmenting 3D image data into 2D patches, reconstructing it into a 2D image, and encoding it using a standard 2D video codec such as High Efficiency Video Coding (HEVC).

In V-PCC, this method of segmenting 3D image data into patches (patch segmentation) is performed through the steps of normal vector prediction, initial segmentation, and refine segmentation.

The above information disclosed in this Background section is only for enhancement of understanding of the background of the invention and it may therefore contain information that does not form the prior art that is already known to a person of ordinary skill in the art.

SUMMARY

The present disclosure intends to minimize deterioration of image quality while lowering the amount of computation and memory usage by refining not all grids, but only grids including edge portions in a method of V-PCC's 3D grid-based refining of segmentation.

Meanwhile, other aspects not specified of the present disclosure will be additionally contemplated within the range that can be easily inferred from the following detailed description and effects thereof.

The apparatus for fast refining segmentation for V-PCC encoder according to an embodiment of the present disclosure includes a grid segmentation unit for segmenting a coordinate space of a point cloud into grid units; an edge cube search unit for searching for a cube containing one or more points among the cubes segmented into grid units and containing a segment boundary; a surrounding cube search unit for searching for an edge surrounding cube containing one or more points within a predetermined range from the edge cube; a smooth score calculation unit for calculating smooth scores for all the edge surrounding cubes and all the edge cubes; and a projection plane index update unit for obtaining a normal score based on the calculated smooth scores and updating a projection plane index of each point in the edge cube using the normal score.

The edge cube search unit may search for a direct edge cube containing one or more points, wherein one or more points included in the direct edge cube include two or more points having different projection plane index values.

The edge cube search unit may search for an indirect edge cube located around the edge cube and containing one or more points.

The edge cube search unit may also search for a cube containing only one point as a direct edge cube.

The surrounding cube search unit may search for a cube containing one or more points within a predetermined radius or a predetermined number of cubes around the edge cube as an edge surrounding cube.

The smooth score calculation unit may calculate a cube smooth score that is the number of points having the same projection plane index in the edge surrounding cube, and calculate a smooth score obtained by summing all the cube smooth scores, and the projection plane index update unit may obtain a normal score that is a product of a normal vector and a projection plane vector of each point in the edge cube, and calculate a final score value by adding a value of the smooth score divided by the number of points in the edge cube and multiplied by weight, to the normal score.

The projection plane index update unit may set the final score value as a best score if the final score value for the projection plane index of the point in the edge cube is greater than the best score, and update the projection plane index of the point with the projection plane index.

The method for fast refining segmentation for V-PCC encoder according to another embodiment of the present disclosure may include segmenting a coordinate space of a point cloud into grid units; searching for a cube containing one or more points among the cubes segmented into grid units and containing a segment boundary; searching for an edge surrounding cube containing one or more points within a predetermined range from the edge cube: calculating smooth scores for all the edge surrounding cubes and all the edge cubes; and obtaining a normal score based on the calculated smooth scores and updating a projection plane index of each point in the edge cube and the edge surrounding cube using the normal score.

According to the present disclosure, since the projection plane index update operation is performed only on the cube containing the segment boundary and the cubes adjacent thereto, the speed of the refining segmentation can be doubled or more, and the decrease in the compression rate is negligible.

In the meantime, even if there is an effect not explicitly specified herein, it is added that the effects expected by the technical features of the present disclosure and described effects and provisional effects thereof in the following specification are regarded as described in the specification of the present disclosure.

BRIEF DESCRIPTION OF THE DRAWINGS

The above and other aspects, features, and advantages of the present disclosure will become more apparent to those of ordinary skill in the art by describing embodiments thereof in detail with reference to the accompanying drawings.

The accompanying drawings are exemplified by reference for understanding the technical idea of the present disclosure, and the scope of the present disclosure is not limited thereto.

DETAILED DESCRIPTION

The grid-based refining of segmentation method, which is one of the conventional refining of segmentation methods, segments the point cloud space into a three-dimensional grid, searches for a three-dimensional grid containing one or more points, and uses the surrounding three-dimensional grid to refine the projection plane index of points in the current three-dimensional grid.

However, the grid-based refining of segmentation method has a problem that the amount of computation or memory access is very high because the projection plane index of individual points is updated several times through iteration over the entire space.

The inventors of the present disclosure have tried to solve the problem of the grid-based refining of segmentation method of the related art. The present disclosure has been completed after a lot of effort to complete an apparatus and method for refining of segmentation capable of obtaining sufficient effects while refining only the necessary 3D grid rather than refining all 3D grids containing points.

Hereinafter, a configuration of the present disclosure guided by various embodiments of the present disclosure and effects resulting from the configuration will be described with reference to the drawings. In describing the present disclosure when it is determined that a detailed description of a related known function obvious to those skilled in the art may unnecessarily obscure the subject matter of the present disclosure, the detailed description thereof will be omitted.

Terms such as 'first' and 'second' may be used to describe various elements, but, the above elements should not be limited by the terms above. The terms may only be used to differentiate one element from another. For example, without departing from the scope of the present disclosure, 'first element' may be named 'second element' and similarly, 'second element' may also be named 'first element.' In addition, expressions in the singular include plural expressions unless explicitly expressed differently in context. Unless otherwise defined, the terminology used in the embodiments of the present disclosure may be interpreted as meanings commonly known to those of ordinary skill in the art.

Hereinafter, a configuration of the present disclosure guided by various embodiments of the present disclosure and effects resulting from the configuration will be described with reference to the drawings.

Figure 1:
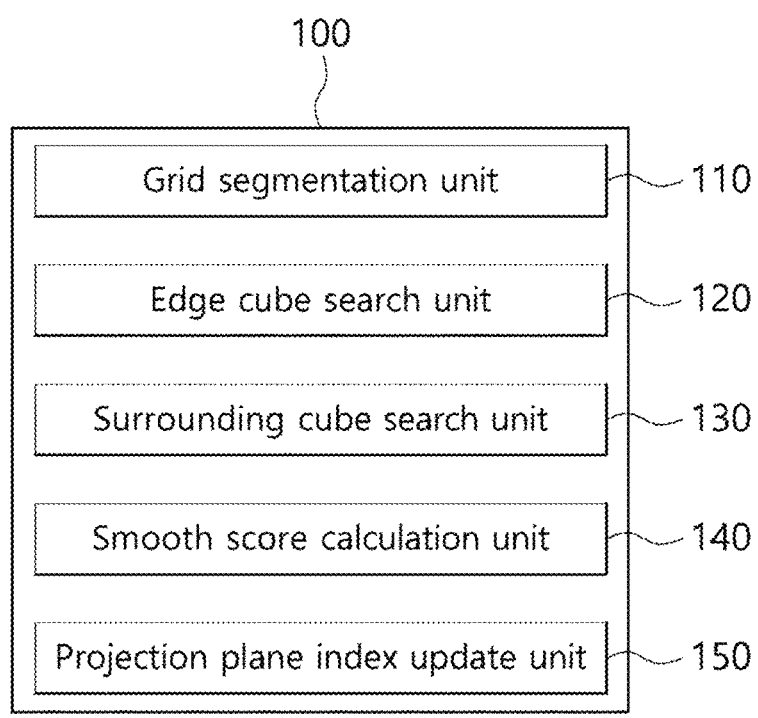
FIG. 1 is a schematic structural diagram of an apparatus for fast refining segmentation for V-PCC encoder according to a preferred embodiment of the present disclosure.

FIG. 1 is a schematic structural diagram of an apparatus for fast refining segmentation for V-PCC encoder according to a preferred embodiment of the present disclosure.

The apparatus for fast refining segmentation 100 includes a grid segmentation unit 110, an edge cube search unit 120, a surrounding cube search unit 130, a smooth score calculation unit 140, and a projection plane index update unit 150.

In addition, the apparatus for fast refining segmentation 100 includes one or more processors or memories (not shown) to perform refining segmentation. To this end, instruction codes for driving the processor and necessary data may be stored in the memory.

The grid segmentation unit 110 reconstructs the point cloud coordinate space by segmenting it into predetermined grids.

Figure 2:
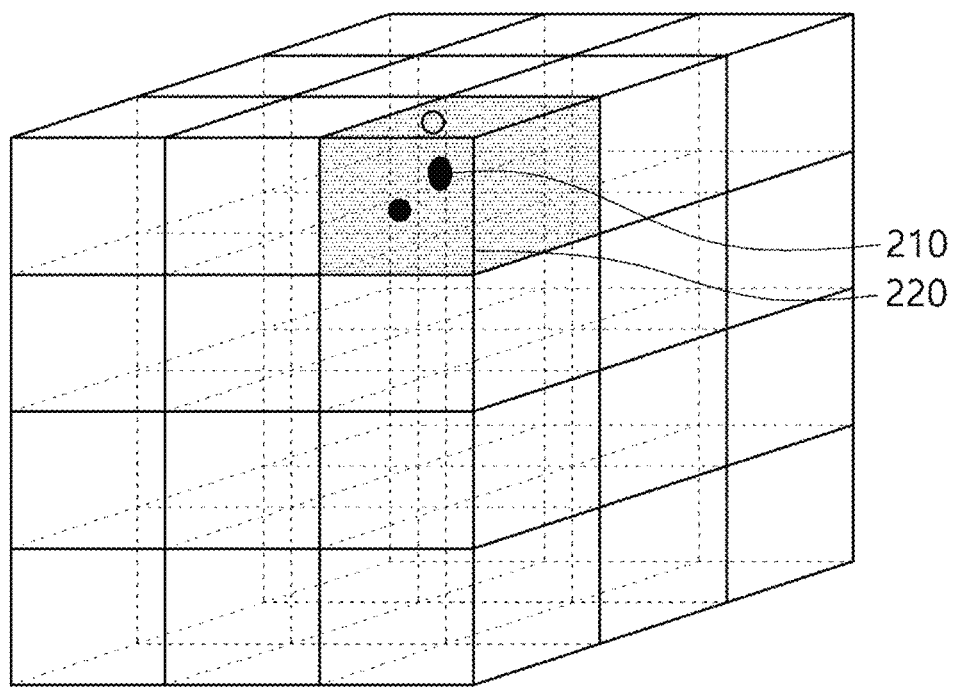
FIG. 2 shows an example of partitioning a grid according to a preferred embodiment of the present disclosure.

FIG. 2 shows an example of segmenting a grid according to a preferred embodiment of the present disclosure.

The grid segmentation unit 110 segments 3D space including points 210 into grids at regular intervals. As a result of the segmentation, a unit cube 220 may include points 210 or there are cubes that do not include points.

The edge cube search unit 120 search for edge cubes among cubes segmented by the grid segmentation unit 110. The edge cube (edgeFilledCubes) refers to a cube that contains one or more points and segment (cluster) boundary.

The segment refers to a set of points (cluster) having the same projection plane index. The present disclosure intends to reduce the amount of computation and memory usage by not performing refinement on all the points of the segment, but refinement only on the boundary of the segment and the surrounding cubes. This is because there is a high possibility that the projection plane index is incorrectly set at the points of the segment boundary.

The edge cube includes a direct edge cube in which points in the cube have different projection plane indices among cubes including two or more points, and an indirect edge cube located around the direct edge cube and including one or more points. In addition, the edge cube search unit 120 may also set a cube including only one point as a direct edge cube.

The indirect edge cube candidate may be set differently according to the size of the cube.

Figure 3:
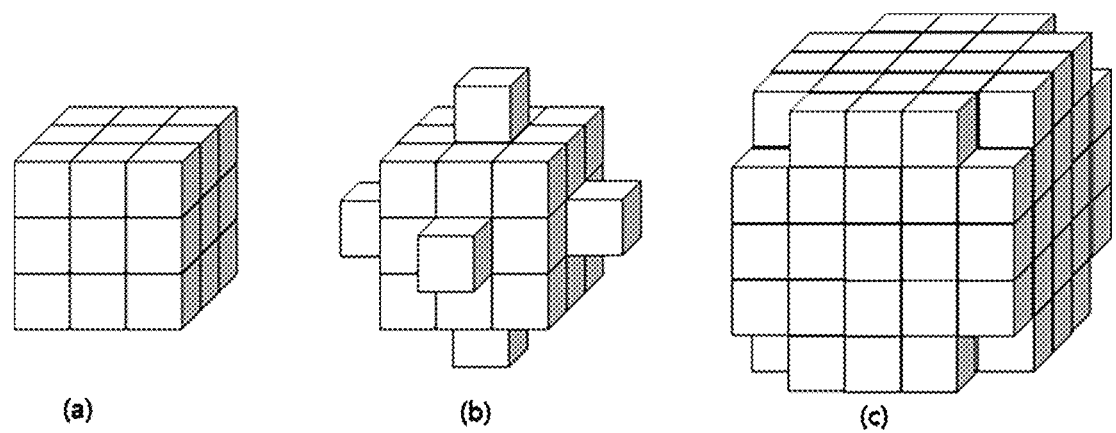
FIG. 3 shows an example of an indirect edge cube candidate according to a preferred embodiment of the present disclosure.

FIG. 3 shows an example of an indirect edge cube candidate according to a preferred embodiment of the present disclosure.

FIG. 3(a) shows a case where the number of indirect edge cube candidates is 26 (3*3*3−1) when the cube size is large (pixel size is 4×4×4 or 8×8×8). Alternatively, as shown in FIG. 3(b), the number of candidates may be set to 32 (3*3*3+6−1) by further including 6 cubes adjacent to the center of each side.

FIG. 3(c) is an example of an indirect edge cube candidate when the size of the cube is small, that is, the size is 2×2×2 or 4×4×4. The number of indirect edge cube candidates may be 116 (5*5*5−8−1).

It is of course possible to set the cubes around the direct edge cube as indirect edge cube candidates by another method not shown in the example of FIG. 3.

Since the number of points to be included varies according to the size of the unit cube, the number of indirect edge cube candidates can be varied according to the size of the cube in order to increase the number of points that can be referenced to a certain or more.

Figure 4:
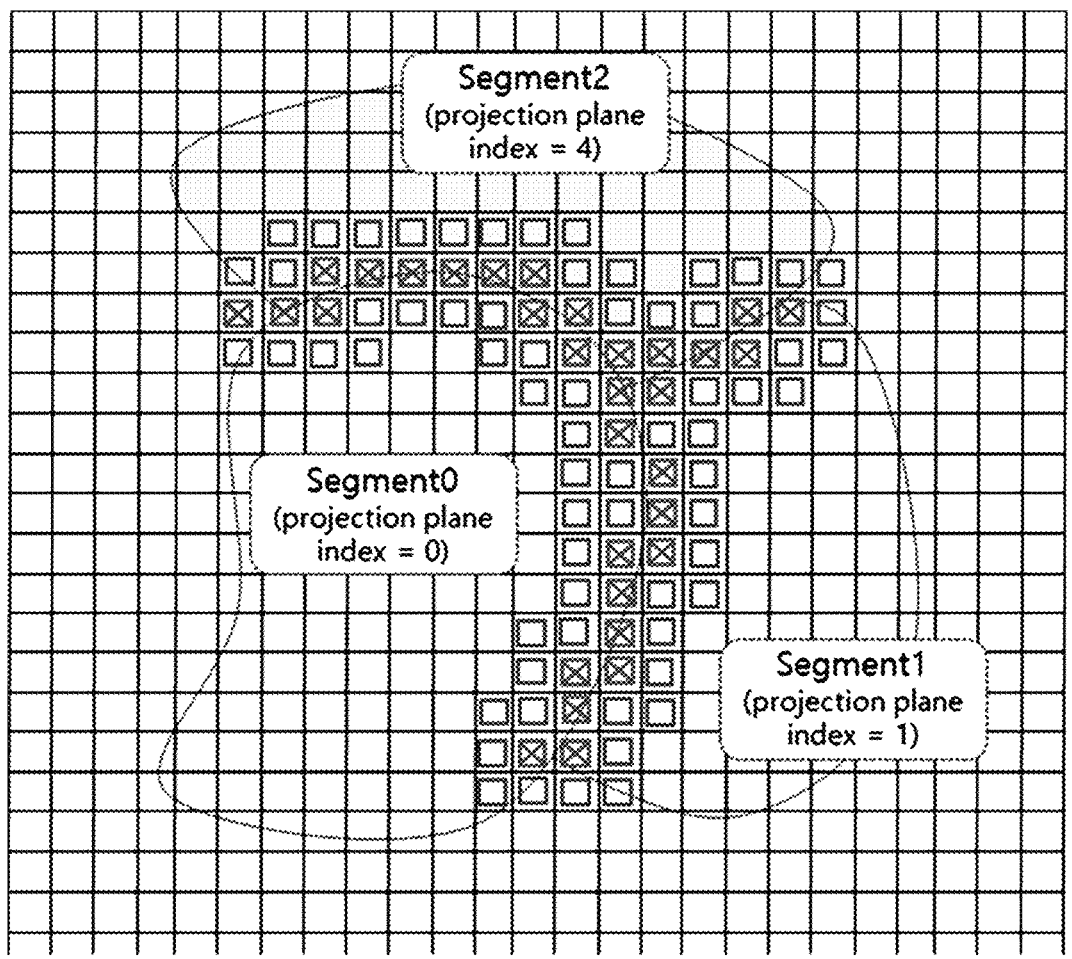
FIG. 4 shows an example of searching edge cubes according to a preferred embodiment of the present disclosure.

FIG. 4 shows an example of searching edge cubes according to a preferred embodiment of the present disclosure.

FIG. 4 illustrates a 2D image as an example for convenience of description, but the same is applied to a 3D point cloud.

In the example of FIG. 4, points having the same projection plane index constitute one segmentation. That is, segmentation 0 is a collection of points with a projection plane index of 0, segmentation 1 is a collection of points with a projection plane index of 1, and segmentation 2 is a collection of points with a projection plane index of 4.

In FIG. 4, X squares represent direct edge cubes and normal squares represent indirect edge cubes.

The surrounding cube search unit 130 searches for surrounding cubes of edge cubes determined in this way. This is to refer to the projection plane vector of the surrounding points in order to refine the segment by updating the projection plane index of the points in the edge cube.

Edge surrounding cubes (nnFilledCubes) may be defined as cubes within a certain radius of each edge cube or a predetermined number of cubes. Among these cubes, a cube including at least one point is set as an edge surrounding cube.

The smooth score calculation unit 140 calculates a cube smooth score (cubeScoreSmooth) and a smooth score (scoreSmooth) for the edge surrounding cube and each edge cube.

The cube smooth score (cubeScoreSmooth[v][p]) for the cube index v of the edge surrounding cube and the projection plane index p means the number of points having the projection plane index p in the edge surrounding cube.

In order to determine the major projection planes of the surrounding cubes using this value, a smooth score (scoreSmooth[v][p]) is calculated by summing the cube smooth score values of each of the edge surrounding cubes. The smooth score may be calculated by the following equation:

$$\text{scoreSmooth}[v][p] = \Sigma_{i=1}^{size(nnFilledcubes[v])} \text{cubeScoreSmooth}[v_j][p]$$

Here, size(nnFilledCubes[v]) denotes the number of edge surrounding cubes (nnFilledCubes[v]), and $v_j$ denotes the cube index of the j-th edge surrounding cube.

The final score is calculated from the obtained smooth score. The normal score (scoreNormal[i][p]) for the point index i and the projection plane index p is obtained by multiplying the normal vector (normal[i]) of the i-th point and the projection plane vector for the projection plane index p.

$$\text{scoreNormal}[i][p] = \text{normal}[i] \cdot \text{orientation}[p]$$

The final score (score[i][p]) is calculated by adding a value of the smooth score (scoreSmooth[v][p]) multiplied by the weight (k) which is divided by the number of points included in the edge surrounding cubes (nnNumPoints) to the normal score (scoreNormal[i][p]).

$$\text{score}[i]p = \text{score Normal }[i][p] + \frac{\lambda}{nnNumPoints} \times \text{scoreSmooth}[v][p]$$

The weight λ may be set to 3 as a default value.

The projection plane index update unit 150 updates the projection plane index of each point according to the final score.

For points in each edge cube, the projection plane index of the corresponding point is updated by comparing the best score (bestScore) and the final score (score[i][p]). The best score is initially set to 0, and if the final score value is larger by comparing the best score with the final score of the corresponding point, the final score is set as the best score, and the projection plane index of the corresponding point is updated to p.

The smooth score calculation unit 140 and the projection plane index update unit 150 increase the iteration count (iterationCount) value and repeatedly update the projection plane index of points included in the edge cubes (edgeFilledCube) until the maximum iteration count (maxIterCount) is reached.

Figure 5:
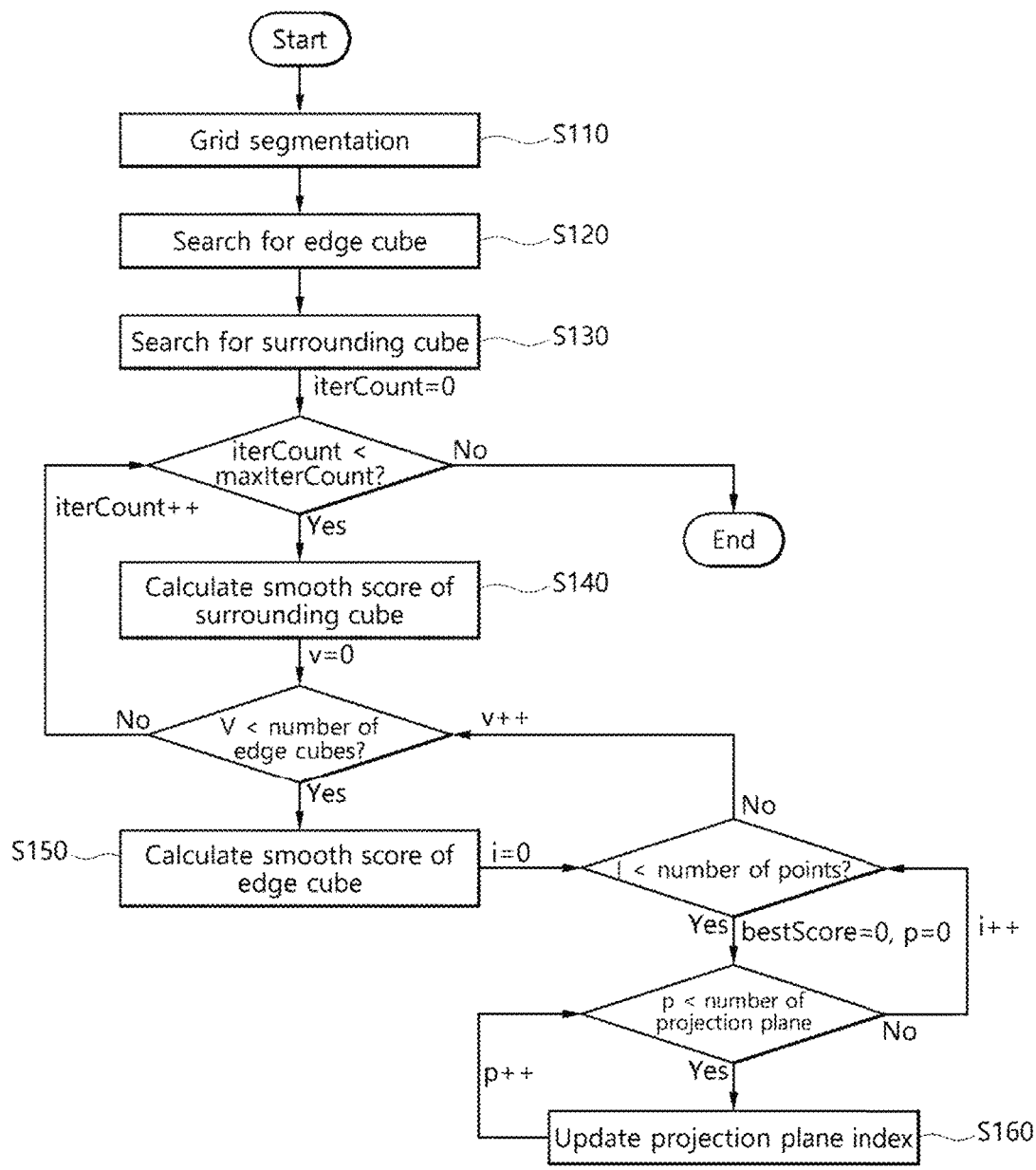
FIG. 5 is a summary of a method for fast refining segmentation for V-PCC encoder according to a preferred embodiment of the present disclosure.

FIG. 5 is a summary of a method for fast refining of patch segment for V-PCC encoder according to a preferred embodiment of the present disclosure.

A three-dimensional space including segments to be refined is segmented into grids at regular intervals at step S110. The size of the grid may be set differently according to the characteristics of the point cloud. Each cube divided into a grid may or may not contain points constituting a point cloud.

Next, edge cubes on which fast refining of patch segment is to be performed are searched among the segmented each cube at step S120. It is possible to perform fast refining segmentation by not performing segment refinement on all points as in the related art, but by searching for edges, that is, cubes including a boundary, and performing refinement only on points included in the edge cube.

The edge cube refers to a cube that contains one or more points and segment (cluster) boundary.

The edge cube includes a direct edge cube in which points in the cube have different projection plane indices among cubes including two or more points, and an indirect edge cube located around the direct edge cube and including one or more points. A method of setting an indirect edge cube candidate for setting an indirect edge cube is as described in FIG. 3.

After the edge cube is searched, the edge surrounding cube to be referred to for segment refinement is searched at step S130. Edge surrounding cubes may be defined as cubes within a certain radius of each edge cube or a predetermined number of cubes. Among these cubes, a cube including at least one point is set as an edge surrounding cube.

Next, a smooth score is calculated from the set edge surrounding cubes and edge cubes at steps S140 and S150. The smooth score is calculated as a cube smooth score for the edge surrounding cubes and a smooth score for the edge cubes to update the projection plane index. The final score may be calculated by multiplying the smooth score by the weight and adding the normal score.

Finally, the final score is compared with the best score to update the projection plane index of each point in the edge cube at step S160. The best score is initially set to 0, and if the final score value is larger by comparing the best score with the final score of the corresponding point, the final score is set as the best score, and the projection plane index of the corresponding point is updated to p.

As these processes are repeated for points included in all edge cubes, refining of patch segment is completed.

According to the apparatus and method for fast refining segmentation according to the present disclosure as described above, by performing segment refinement only on points included in edge cubes at the boundary of the segment, there is an advantage in that the amount of computation and memory usage required for segment refinement can be reduced, and fast refining segmentation can be performed.

The scope of protection of the present disclosure is not limited to the description and expression of the embodiments explicitly described above. In addition, it is added once again that the scope of protection of the present disclosure may not be limited due to obvious changes or substitutions in the technical field of the present disclosure.

What is claimed is:

1. An apparatus for fast refining segmentation for a video-based point cloud compression (V-PCC) encoder, the apparatus comprising:
   a grid segmentator configured to segment a coordinate space of a point cloud into grid units;

an edge cube searcher configured to search an edge cube containing one or more points among the cubes segmented into grid units and containing a segment boundary;
a surrounding cube searcher configured to search an edge surrounding cube containing one or more points within a predetermined range from the edge cube;
a smooth score calculator configured to calculate smooth scores for all the edge surrounding cubes and all the edge cubes; and
a projection plane index updater configured to obtain a normal score based on the calculated smooth scores and update a projection plane index of each point in the edge cube using the normal score,
wherein the edge cube searcher is configured to:
search a direct edge cube containing two or more points, and
search an indirect edge cube located around the edge cube and containing one or more points.

2. The apparatus of claim 1, wherein the two or more points included in the direct edge cube include two or more points having different projection plane index values.

3. The apparatus of claim 2, wherein the edge cube searcher is configured to search a cube containing only one point as a direct edge cube.

4. The apparatus of claim 1, wherein the surrounding cube searcher is configured to search a cube containing one or more points within a predetermined radius or a predetermined number of cubes around the edge cube as an edge surrounding cube.

5. The apparatus of claim 1, wherein the smooth score calculator is configured to calculate a cube smooth score that is the number of points having the same projection plane index in the edge surrounding cube, and calculate a smooth score obtained by summing all the cube smooth scores, and
wherein the projection plane index updater is configured to obtain a normal score that is a product of a normal vector and a projection plane vector of each point in the edge cube, and calculate a final score value by adding a value of the smooth score divided by the number of points in the edge cube and multiplied by weight, to the normal score.

6. The apparatus of claim 5, wherein the projection plane index updater is configured to set the final score value as a best score in response to the final score value for the projection plane index of the point in the edge cube being greater than the best score, and update the projection plane index of the point with the projection plane index.

7. A method for fast refining of patch segment for a video-based point cloud compression (V-PCC) encoder, the method comprising:
segmenting, at a processor, a coordinate space of a point cloud into grid units;
searching, at the processor, an edge cube containing one or more points among the cubes segmented into grid units and containing a segment boundary;
searching, at the processor, an edge surrounding cube containing one or more points within a predetermined range from the edge cube;
calculating, at the processor, smooth scores for all the edge surrounding cubes and all the edge cubes; and
obtaining, at the processor, a normal score based on the calculated smooth scores and updating, at the processor, a projection plane index of each point in the edge cube and the edge surrounding cube using the normal score,
wherein searching the edge cube comprises:
searching a direct edge cube containing two or more points; and
searching an indirect edge cube located around the edge cube and containing one or more points.

8. An apparatus for fast refining segmentation for a video-based point cloud compression (V-PCC) encoder, the apparatus comprising:
one or more processors configured to:
segment a coordinate space of a point cloud into grid units;
search an edge cube containing one or more points among the cubes segmented into grid units and containing a segment boundary;
search an edge surrounding cube containing one or more points within a predetermined range from the edge cube;
calculate smooth scores for all the edge surrounding cubes and all the edge cubes; and
obtain a normal score based on the calculated smooth scores and update a projection plane index of each point in the edge cube using the normal score,
wherein the one or more processors are further configured to:
search a direct edge cube containing two or more points, and
search an indirect edge cube located around the edge cube and containing one or more points.

* * * * *